(12) United States Patent
Hsieh et al.

(10) Patent No.: US 11,362,060 B2
(45) Date of Patent: Jun. 14, 2022

(54) METHOD AND STRUCTURE FOR DIE BONDING USING ENERGY BEAM

(71) Applicant: EPISTAR CORPORATION, Hsinchu (TW)

(72) Inventors: Min-Hsun Hsieh, Hsinchu (TW); Shih-An Liao, Hsinchu (TW); Ying-Yang Su, Hsinchu (TW); Hsin-Mao Liu, Hsinchu (TW); Tzu-Hsiang Wang, Hsinchu (TW); Chi-Chih Pu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 385 days.

(21) Appl. No.: 16/551,764

(22) Filed: Aug. 27, 2019

(65) Prior Publication Data

US 2020/0243478 A1 Jul. 30, 2020

Related U.S. Application Data

(60) Provisional application No. 62/797,082, filed on Jan. 25, 2019.

(51) Int. Cl.
*H01L 23/00* (2006.01)
*H01L 25/16* (2006.01)
*H01L 25/075* (2006.01)
*H01L 23/498* (2006.01)
(Continued)

(52) U.S. Cl.
CPC .............. *H01L 24/81* (2013.01); *B23K 26/22* (2013.01); *H01L 23/49866* (2013.01); *H01L 24/83* (2013.01); *H01L 25/0753* (2013.01); *H01L 25/167* (2013.01); *B23K 2101/40* (2018.08); *H01L 2224/81005* (2013.01); *H01L 2224/81224* (2013.01); *H01L 2224/83005* (2013.01); *H01L 2224/83224* (2013.01); *H01L 2924/12041* (2013.01)

(58) Field of Classification Search
CPC .............. H01L 24/81; H01L 23/49866; H01L 2224/81224; H01L 2224/83224; B23K 26/22

See application file for complete search history.

(56) References Cited

U.S. PATENT DOCUMENTS 10,043,784 B2   8/2018   Sakariya et al.

FOREIGN PATENT DOCUMENTS

TW   I641125 B   11/2018

*Primary Examiner* — Robert G Bachner
(74) *Attorney, Agent, or Firm* — Huan-Yi Lin

(57) ABSTRACT

Disclosed is a die-bonding method which provides a target substrate having a circuit structure with multiple electrical contacts and multiple semiconductor elements each semiconductor element having a pair of electrodes, arranges the multiple semiconductor elements on the target substrate with the pair of electrodes of each semiconductor element aligned with two corresponding electrical contacts of the target substrate, and applies at least one energy beam to join and electrically connect the at least one pair of electrodes of every at least one of the multiple semiconductor elements and the corresponding electrical contacts aligned therewith in a heating cycle by heat carried by the at least one energy beam in the heating cycle. The die-bonding method delivers scattering heated dots over the target substrate to avoid warpage of PCB and ensures high bonding strength between the semiconductor elements and the circuit structure of the target substrate.

20 Claims, 20 Drawing Sheets

(51) Int. Cl.
*B23K 26/22* (2006.01)
*B23K 101/40* (2006.01)

METHOD AND STRUCTURE FOR DIE BONDING USING ENERGY BEAM

BACKGROUND OF THE INVENTION

1. Field of the Invention

The present invention relates to a die-bonding method and a die-bonding structure and, more particularly, to a method and a structure using a beam generator to generate at least one energy for die-bonding.

2. Description of the Related Art

One of the buzzwords in light-emitting diode (LED) and liquid crystal display (LCD) marketing recently is "local dimming" Ostensibly, local dimming can dim the area of the screen that needs it, while keeping the bright parts of the screen bright. This technology can really increase the contrast ratio and 3D color gamut to make a better image. As a result, it stands to reason that local dimming is possible with LCD TVs, such that LCD TVs to bear favorable technical comparison with organic light-emitting diode (OLED) TVs in delivering high-definition resolution.

However, the necessity of local dimming resides in a significant number of LEDs mounted on the backlight module, which differ from the approaches for conventional edge-lit TVs and direct-lit TVs. To that end, a huge circuit board is thus required for mounting of LEDs while, statistically, doing so may lead to the issue of low die-bonding yield of LEDs. A countermeasure to the issue is to provide a multi-layer circuit board. Whereas, current circuit boards oftentimes have the warpage problem after reflow soldering as the circuit boards are made by the material including Flame Retardant (FR-4) or bismaleimide-triazine (BT) resin with copper conductors formed thereon.

SUMMARY OF THE INVENTION

An objective of the present invention is to provide a die-bonding method and a die-bonding structure resolving the PCB warpage issue in conventional reflow process and ensuring higher bonding strength between semiconductor elements and target substrate to be bonded.

To achieve the foregoing objective, the die-bonding method, comprising steps of:

(a) providing a target substrate having a circuit structure formed thereon and multiple semiconductor elements; the circuit structure has multiple electrical contacts formed thereon and a glass plate formed therein, and each semiconductor element includes a pair of electrodes;

(b) arranging the multiple semiconductor elements on the target substrate with the pair of electrodes of each semiconductor element aligned with two corresponding electrical contacts of the target substrate; and (c) applying at least one energy beam to join and electrically connect the at least one pair of electrodes of every at least one of the multiple semiconductor elements and the corresponding electrical contacts aligned therewith in a heating cycle by heat carried by the at least one energy beam in the heating cycle.

Preferable, the step (a) further comprises:

determining a bonding type associated with at least one location where at least one bonding material is to be applied and quantity of the at least one bonding material, wherein when the at least one bonding material includes one bonding material and the bonding material is pre-formed on the electrical contacts of the circuit structure of the target substrate, the bonding type is defined to be one, when the at least one bonding material includes one bonding material and the bonding material is pre-formed on the pairs of electrodes of the semiconductor elements, the bonding type is defined to be two, when the at least one bonding material includes one bonding material and the bonding material is applied to the electrical contacts of the circuit structure of the target substrate before the electrical contacts are aligned with corresponding electrodes at step (b), the bonding type is defined to be three, and when the at least one bonding material includes two bonding materials and one of the two bonding materials is pre-formed on the pairs of electrodes of the semiconductor elements and the other bonding material is applied to the electrical contacts before the electrical contacts are aligned with corresponding electrodes at step (b), the bonding type is defined to be four;

when the bonding type is one, pre-forming the bonding material on each electrical contact of the target substrate;

when the bonding type is two, per-forming the bonding material on each of the pair of electrodes of each semiconductor element;

when the bonding type is three, applying the bonding material to the electrical contacts of the circuit structure of the target substrate; and when the bonding type is four and the at least one bonding material includes a first bonding material and a second material, per-forming the first bonding material on each of the pair of electrodes of each semiconductor element, and applying the second bonding material on each electrical contact of the target substrate.

Preferably, when the bonding type is one, the bonding material is solder paste with a melting point in a range of 140° C. to 300° C. that contains one of a group of metals including tin, titanium, indium, and silver, an alloy selected from a combination of the group of metals, or stacked layers with each layer formed of a metal material selected from the group of metals.

Preferably, when the bonding type is two, the bonding material is solder paste with a melting point in a range of 140° C. to 300° C. that contains one of a group of metals including tin, titanium, indium, and silver, an alloy selected from a combination of the group of metals, or stacked layers with each layer formed of a metal material selected from the group of metals.

Preferably, when the bonding type is three, the first bonding material is a bonding material containing insulating adhesive or adhesive containing flux, or adhesive containing metal particles selected from one of a group of metals including tin, titanium, indium, and silver.

Preferably, when the bonding type is four, the first bonding material is a metal layer of tin or tin-silver, and the second bonding material is flux or insulating adhesive, such as epoxy or silicone.

According to the foregoing die-bonding method, the method employs the approach of generating at least one energy beam and applying the at least one energy beam to heat and electrically connect the pairs of electrodes of the multiple semiconductor elements and the respective electrical contacts of the circuit structure of the target substrate, and various ways of applying bonding materials to the semiconductor elements and the circuit structure, thus significantly reducing the warpage issue of PCB in conventional reflow process by virtue of a dot-scattering heating pattern that is uniformly distributed over the target substrate by heat carried by the at least one energy, and increasing the bonding strength between the semiconductor elements and the circuit structure of the target substrate with a variety ways and materials of the bonding materials.

To achieve the foregoing objective, the die-bonding structure includes a target substrate, multiple semiconductor elements, and a beam generator.

The target substrate has a support base and a circuit structure.

The circuit structure is formed on one side of the supporting base and has a glass plate, a transparent conductive layer, a metal layer, a bonding-reinforced circuit layer, and multiple electrical contacts.

The glass plate is formed on the supporting base.

The transparent conductive layer is formed on the glass plate.

The metal layer is formed on the transparent conductive layer.

The bonding-reinforced circuit layer is formed on the metal layer.

The multiple electrical contacts are formed on the bonding-reinforced circuit layer.

The multiple semiconductor elements are attached to a carrier plate and are spaced apart from each other by gaps. Each semiconductor element has a pair of electrodes aligned with two corresponding electrical contacts of the circuit structure of the target substrate.

The beam generator generates at least one energy beam for joining and electrically connecting the at least one pair of electrodes of every at least one of the multiple semiconductor elements and the corresponding electrical contacts aligned therewith in a heating cycle by heat carried by the at least one energy beam in the heating cycle.

In view of the foregoing die-bonding structure, the beam generator that generates at least one energy beam and applies the at least one energy beam to heat and electrically connect the multiple semiconductor elements and the circuit structure of the target substrate addresses a solution to the warpage issue of PCB involved with a dot-scattering heating pattern uniformly distributed over the target substrate by heat carried by the at least one energy, and the circuit structure and the bonding materials delivering higher bonding strength between the semiconductor elements and the circuit structure of the target substrate because the bonding strength between the circuit structure of the target substrate and the semiconductor elements can be enhanced as a result of the circuit designs tailored to the drawbacks of the conventional COG (chip on glass) circuit, a multitude of bonding materials, and a variety of ways of applying the bonding materials.

Other objectives, advantages and novel features of the invention will become more apparent from the following detailed description when taken in conjunction with the accompanying drawings.

BRIEF DESCRIPTION OF THE DRAWINGS

FIG. 5A is an enlarged schematic diagram of the bonding material pre-formed on the pair of electrodes of one of the semiconductor elements of the die-bonding structure in FIG. 5;

FIG. 6A is an enlarged schematic diagram of the bonding material applied to two of the electrical contacts of the circuit structure of the die-bonding structure in FIG. 6;

FIG. 7A is an enlarged schematic diagram of the two bonding materials respectively pre-formed on each electrode and a corresponding electrical contact of the die-bonding structure in FIG. 7;

DETAILED DESCRIPTION OF THE INVENTION

Figure 1:
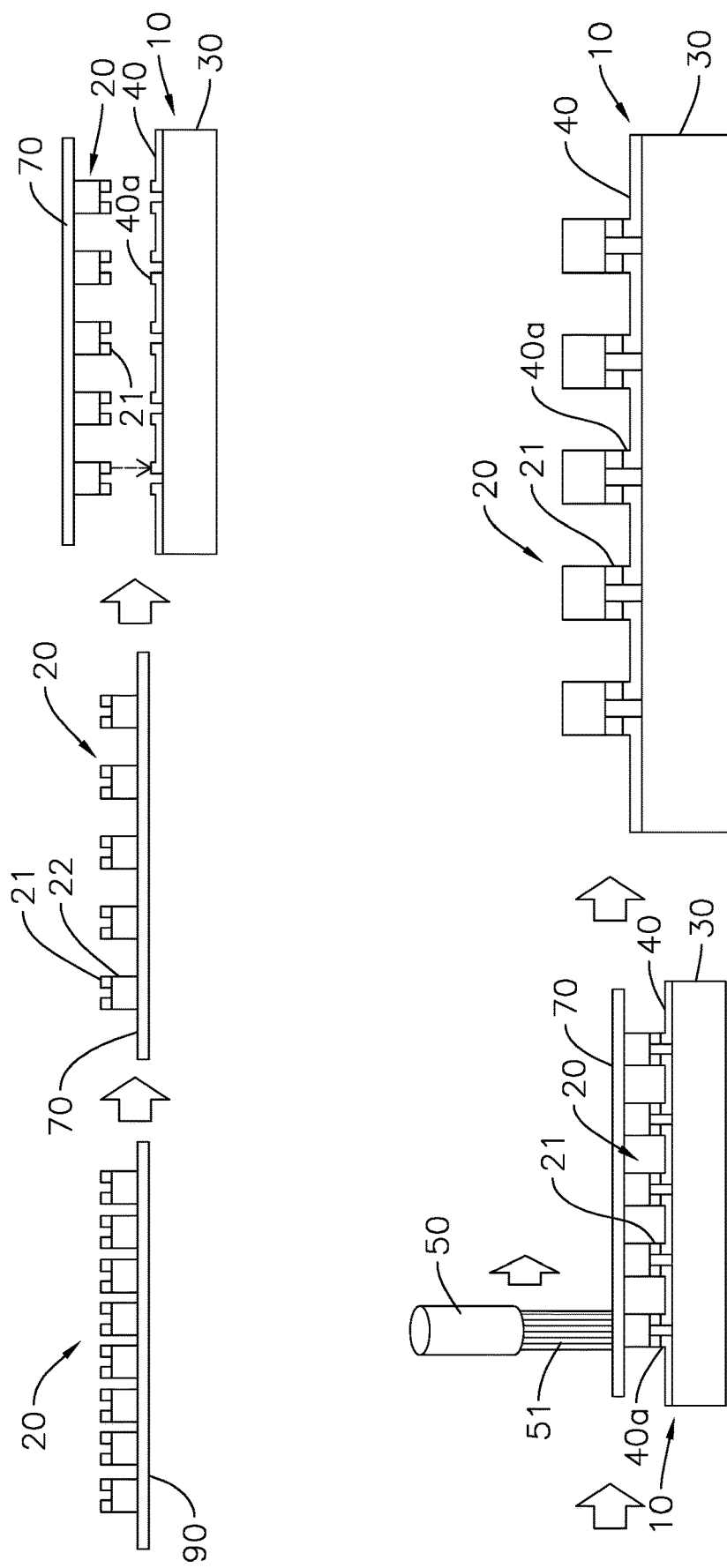
FIG. 1 is a schematic diagram showing a die-bonding process in accordance with the present invention.

With reference to FIG. 1, a first embodiment of a die-bonding structure using energy beam in accordance with the present invention includes a target substrate 10, multiple semiconductor elements 20, and a beam generator 50.

The target substrate 10 has a supporting base 30 and a circuit structure 40. The supporting base 30 may be made from glass epoxy laminate material, such as FR4 and BT (Bismaleimide Triazine) printed circuit board (PCB), or glass substrate, for itself to be transparent to energy beam. The circuit structure 40 is formed on one side of the supporting base 30 and has multiple electrical contacts 40a. The target substrate 10 includes but is not limited to one of a PCB, a flexible PCB, a glass circuit board, and a backplane with thin-film transistor (TFT) circuits or pulse width modulation (PWM) driving circuits.

The multiple semiconductor elements 20 are attached to a carrier plate 70 in the form of a matrix and are spaced apart from each other by gaps. Each of the multiple semiconductor elements 20 has a pair of electrodes 21. The gaps may include a horizontal pitch and a vertical pitch. In other words, the multiple semiconductor elements 20 may be arranged at intervals horizontally and vertically by the horizontal pitch and the vertical pitch respectively to facilitate alignment between the pairs of electrodes of the multiple semiconductor elements 20 and the respective electrical contacts 40a on the target substrate 10. Each of the multiple semiconductors 20 may include but is not limited to a light-emitting diode (LED) with the pair of electrodes 21 and multiple light-emitting layers 22 stacked to each other, and the LED may include a growth substrate or a bonding substrate for supporting the multiple light-emitting layers 22, or.

The beam generator 50 generates at least one energy beam 51 and joins and electrically connects the at least one pair of electrodes 21 of every at least one of the multiple semiconductor elements 20 and the corresponding electrical contacts 40a when aligned therewith in a heating cycle by heat carried by the at least one energy beam 51 in the heating cycle until the pairs of electrodes 21 of the multiple semiconductor elements 20 and the respective electrical contacts 40a of the target substrate aligned therewith are heated and electrically connected.

Depending on heating and fabrication situations, the beam generator 50 may be placed on the same side of the semiconductor elements 20 and next to the semiconductor elements 20, or on the same side of the target substrate 10 and next to the target substrate 10. When the beam generator 50 is placed next to the multiple semiconductor elements 20 as shown in FIG. 1, heat carried by the at least one energy beam 51 in the heating cycle first transfers to the at least one of the multiple semiconductor elements 20 before transferring to corresponding junction between the at least one pair of electrodes 21 of the every at least one of the multiple semiconductor elements 20 and the corresponding electrical contacts 40a aligned therewith. There are situations that integrated circuit (IC) chips have been already die-bonded to the surface of the supporting base 30 of the target substrate that is opposite to the surface on which the circuit structure 40 is formed. In that case, when the semiconductor elements 20 are die-bonded on the circuit structure 40 of the target substrate 10, this can be done by reflow soldering conventionally. However, the bonding strength between the ICs and the target substrate 10 may be weakened by the reflow process and getting worse if repeated times of reflow soldering are required. Unlike a planar heating pattern in the conventional reflow soldering, heated portions done by the energy beam in the present invention pertains to a distribution of heated dots in the form of a matrix, which is advantageous in having little adverse heating effect against the bonding between the ICs and the target substrate 10, as most of the heat concentrated at each dot is absorbed by the corresponding semiconductor element 20 and the target substrate 10, if the energy beam 51 is located on the same side of the semiconductor elements 20.

Figure 2:
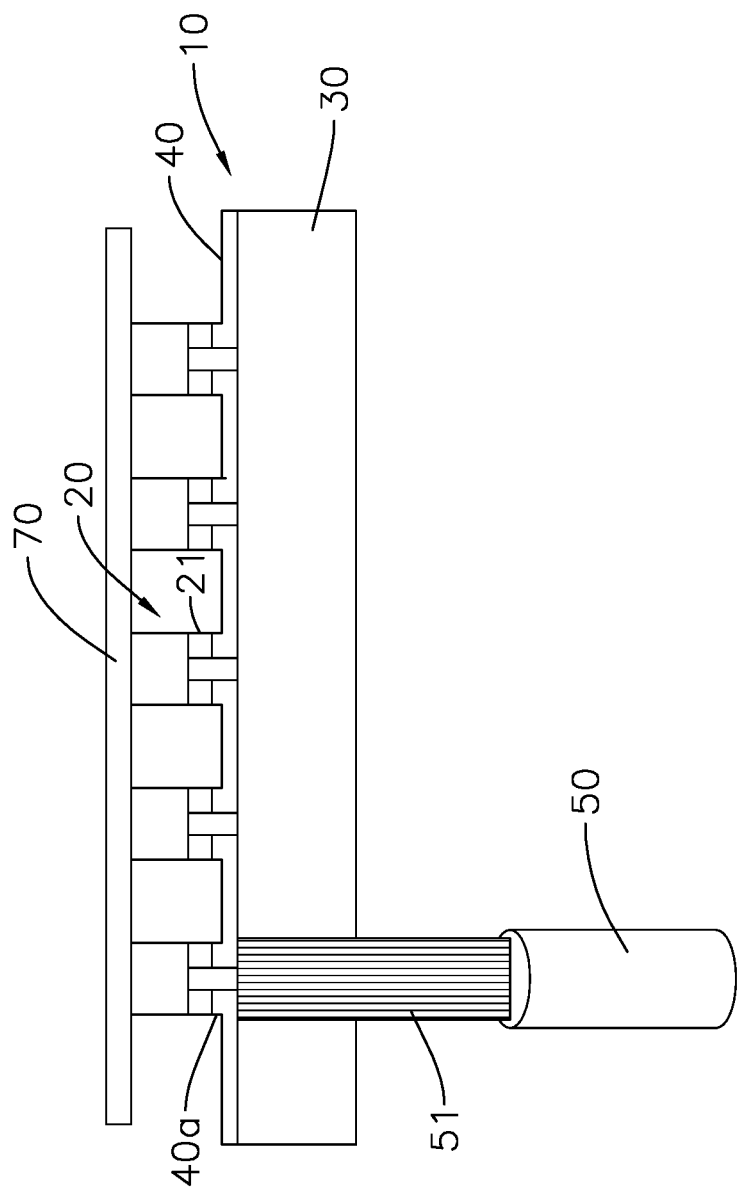
FIG. 2 is a schematic diagram showing a beam generator of the die-bonding structure in FIG. 1 placed next to a target substrate of the die-bonding structure and generating an energy beam.

This means that heat carried by the at least one energy beam 51 is partially absorbed by the at least one of the multiple semiconductor elements 20. With reference to FIG. 2, when the beam generator 50 is placed next to the target substrate 10, if the supporting base 30 is transparent to the at least one energy beam, unless refracted by the supporting base 30, most of the at least one energy beam 51 generated in the heating cycle penetrate through the supporting base 30 of the target substrate 10 and then heat propagate to the at least one pair of electrodes 21 of the every at least one of the multiple semiconductor elements 20 and the corresponding electrical contacts 40a of the circuit structure 40. Because the supporting base 30 of the target substrate 10 is transparent to the at least one energy beam 51 and do not absorb energy of the at least one energy beam 51, except a small portion of the at least one energy beam 51 refracted and not directed to the targeted electrodes 21 and electrical contacts 40a, most of the at least one energy beam 51 are irradiated to corresponding electrodes 21 and electrical contacts 40a with heat carried thereby transferring to the corresponding electrodes 21 and electrical contacts 40a. As such, when the beam generator 50 is placed on the same side of the target substrate 10, as a result of effective heat transfer through the target substrate 10, the heating cycle can be shortened to increase die-bonding efficiency in fabrication. Besides, because of heat not going through the semiconductor elements, the impact on the semiconductor elements due to the heating effect of beam generator 50 may be mitigated.

In one embodiment concerning the number of the at least one energy beam and the way of beam irradiation, with further reference to FIG. 1, the at least one energy beam 51 generated by the beam generator 50 includes one energy beam 51 applied to heat and electrically connect the pair of electrodes 21 of one of the multiple semiconductor elements 20 and two corresponding electrical contacts 40a of the target substrate 10 in the heating cycle. In another relevant embodiment, with reference to FIG. 3, the at least one energy beam 51 generated by the beam generator 50 includes one energy beam 51 applied to heat and electrically connect the pairs of electrodes 21 of at least two of the multiple semiconductor elements 20 and the corresponding electrical contacts 40a of the target substrate 10 in the heating cycle. In yet another relevant embodiment, with reference to FIG. 4, the at least one energy beam 51 generated by the beam generator 50 includes at least two energy beams 31 applied to respectively heat and electrically connect the pairs of electrodes 21 of at least two of the multiple semiconductor elements 20 and the corresponding electrical contacts 40a of the target substrate 10 in the heating cycle. As for the duration of the heating cycles mentioned in the aforementioned embodiments, they all fall in a range of 0.001 second to 1 second. As far as type of the at least one energy beam is concerned, each of the at least one energy beam may be a laser beam producing one of ultraviolet (UV) light, visible light and infrared (IR) light. When each of the at least one energy beam is an IR laser beam, its wavelength ranges from 1,000 nm to 2,000 nm.

Before we move on to the following embodiments, definition of certain terms needs to be stated in advance. When we say 'pre-forming a bonding material on an electrical contact 40a or one of the pair of electrodes 21, it means that the bonding material is formed on the target substrate 10 or the corresponding semiconductor 20 during their semiconductor fabrication processes. When we say 'applying a bonding material on an electrical contact 40a', it means that the bonding material is applied to the electrical contact 40a of the target substrate 10 between before the target substrate 10 is aligned with the multiple semiconductor elements 20. To enhance bonding strength and facilitate bonding the semiconductor elements 20 to the target substrate 10 in fabrication, several types of bonding materials and ways for applying them are employed and are applied to the target substrate 10, to the semiconductor elements 20, and between the multiple electrical contacts 40a of the target substrate 10 and corresponding electrodes 21 of the semiconductor elements 20. In a first relevant embodiment, with reference to FIGS. 5 and 5A, solder paste 80A with a melting point in a range of 140° C. to 300° C. and containing one of a group of metals including tin, titanium, indium, and silver or an alloy selected from a combination of the group of metals, or stacked layers with each layer formed of a metal material selected from one of the group of metals, is pre-formed on each of the pair of electrodes 21 of each semiconductor element 20 or on each electrical contact 40a of the circuit structure 40. In a second relevant embodiment, with reference to FIGS. 6 and 6A, adhesive 80C containing insulating adhesive and metal particles 80P selected from one of a group of metals including tin, titanium, indium, silver and the like, is applied to each of the multiple electrical contacts 40a of the circuit structure 40. The insulating adhesive, such as epoxy and silicone, allows the LEDs to be securely formed on the target substrate and facilitates bonding material to be easily spread over the junctions between the electrodes 21 and corresponding electrical contacts 40a, and, by heating the semiconductor elements 20, the metal particles 80P in the adhesive 80C are able to gather and form electrical connection channels 81 between the electrodes 21 and corresponding electrical contacts 40a. In a third relevant embodiment, with reference to FIGS. 7 and 7A, a metal layer 80E of tin or tin-silver is pre-formed on each of the pair of electrodes 21 of each semiconductor element 20, and adhesive 80F, such as epoxy or silicone, is applied to a corresponding electrical contact 40a of the target substrate 10, and then the electrode 21 is aligned with the corresponding electrical contact 40a. In one embodiment, the adhesive 80F comprises flux, and the flux serves to moisturize and clean the metal layer 80E, and protect the metal layer 80E against oxidation. In the end of the die-bonding process, the flux is evaporated and what's left is the metal layer 80E which is in a melting state as a result of the heat carried by the at least one energy beam 51 for the melting metal layer 80E to reach the corresponding electrical contact 40a and form an electrical connection channel 81 between the electrodes 21 and the corresponding electrical contacts 40a.

Alternatively, when the adhesive 80F is employed and one of the semiconductor elements 20 is irradiated by the at least one energy beam 51, the metal layer 80E starts melting and automatically gathers between the corresponding electrodes 21 and the electrical contacts 40a to establish electrical connection channels 81 therebetween. Then, heat carried by the energy beam 51 is transferred to the adhesive 80F to cure it, such that the electrical connection channels 81 can be formed before the adhesive 80F is cured. When a conventional reflow oven is applied instead, the epoxy gets cured earlier than the complete formation of the electrical connection channels 81 done by the metal layer 80E since the adhesive 80F is continuously heated throughout the entire heating process of the reflow oven. However, so that such incomplete formation may lead to undesired open-circuit issue. The way of establishing the electrical connection channels 81 in the present embodiment can be applied to the adhesive 80C containing metal particles 80P in FIGS. 7 and 7A in a similar fashion. After being heated by the energy beam 51, the metal particles 80P of the adhesive 80C automatically establish electrical connection channels 81 between corresponding electrodes 21 and electrical contacts 40a before the adhesive 80C is fully cured. Because of the curing time of the adhesive 80C, 80F later than complete formation of the electrical connection channels 81, heating the bonding material with the energy beam in the present invention ensures a higher success rate in establishing the electrical connection channels 81 or the die-bonding process than the conventional reflow oven.

A common circuit feature for TFT-LCD/AMOLED circuits is a chip-on-glass (COG) circuit that adopts a glass plate as a base for the circuits to be built thereon. The COG circuits are well known to have the benefits including superior and compact design with extremely high densities of components, greater reliability due to the lack of solder joints, good heat-dissipating performance attributable to the substrate and the glass-based circuit, constant evolution owing to more and more fine patterns of different heights, ability to process high speed and high frequency signals, and simpler and more inexpensive production processes than a multi-layer printed circuit board, such as high density interconnections (HDI) board and Bismaleimide Triazine (BT) board, which requires more costly metal layers, making COG circuits ideal for manufacture of PCB involved with aspects of miniatured interconnection, fine conductor pattern and low profile. The circuit structure which is formed right on the top of the glass plate and is available in the market oftentimes includes a transparent and conductive layer, e.g. Indium Tin Oxide (ITO), and a metal layer formed on the ITO. Since not all metals are suitable for formation on ITO, conventionally, the metal layer formed on ITO may be selectively formed of Molybdenum (Mo), aluminum (Al) or aluminum neodymium (AlNd). However, the metal layer with the selected metal has the drawback that LED chips are difficult to be firmly mounted thereon during reflow or eutectic processing because it is hard for the metal layer including Mo or Al and the LED chips to form a eutectic mixture. Hence, to get rid of the drawback and increase the bonding strength between the LED chips and the metal layer of the conventional circuit structure, the foregoing circuit structure 40 can adopt a bonding-reinforced circuit layer, which is further formed on the conventional metal layer as an interface layer with stronger bonding strength to both the conventional metal layer and the LEDs. For more details, the circuit structure 40 including the bonding-reinforced circuit layer is depicted in the following embodiments.

Figure 8:
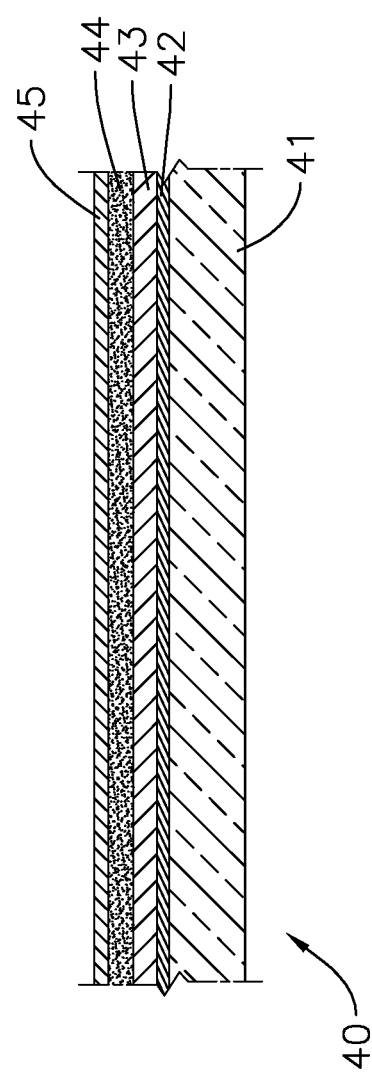
FIG. 8 is a schematic diagram showing a first embodiment of the circuit structure of the target substrate of the of the die-bonding structure in FIG. 1.

With reference to FIG. 8, a first embodiment of the circuit structure 40 of the target substrate 10 in FIG. 1 includes a glass plate 41, a transparent conductive layer 42, a metal layer 43, a bonding layer 44, and a eutectic metal layer 45. In the present embodiment, the conventionally-provided parts include the glass plate 41, the transparent conductive layer 42, and the metal layer 43, and the bonding-reinforced circuit layer includes the bonding layer 44 and the eutectic metal layer 45. The transparent conductive layer 42 is formed on the glass plate 41 and is formed of indium tin oxide (ITO), indium zinc oxide (IZO) or indium gallium zinc oxide (IGZO). The metal layer 43 is formed of molybdenum, aluminum or aluminum neodymium (AlNd) and is formed on the transparent conductive layer 42. The bonding layer 44 is formed of titanium, titanium nitride, layers of titanium nitride and titanium stacked to each other, or layers of titanium nitride, titanium and titanium nitride sequentially stacked to each other. The eutectic metal layer 45 is formed of copper or gold and is formed on the bonding layer 44. To cope with the weak bonding strength between the meal layer 43 and the semiconductor elements 20, such as LEDs, mounted thereon, the bonding-reinforced circuit layer including the bonding layer 44 and the eutectic metal layer 45 as a whole is additionally provided to function as a bonding interface between the metal layer 43 and the semiconductor elements 20 with desired bonding strength to the metal layer 43 and the semiconductor elements 20. Basically, the bonding layer 44 serves as a bonding interface between the metal layer 43 and the eutectic metal layer 45 with desired bonding strengths to the metal layer 43 and the eutectic metal layer 45. As facilitating generation of a eutectic mixture with the semiconductor elements 20, such as LEDs, likewise, the eutectic metal layer 45 serves as a bonding interface between the bonding layer 44 and the semiconductor elements 20 with desired bonding strengths to the bonding layer 44 and the semiconductor elements 20. In one embodiment, being as a part of the circuit structure 40, the multiple electrical contacts 40a are formed on the eutectic metal layer 45.

Figure 9:
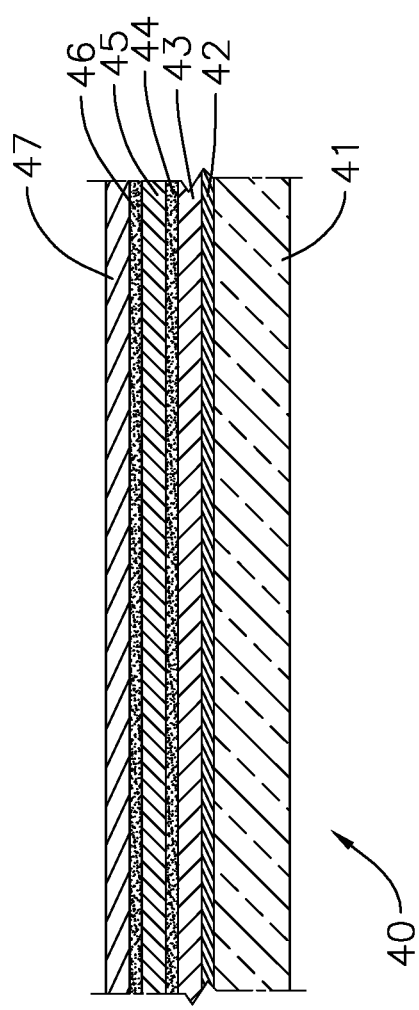
FIG. 9 is a schematic diagram showing a second embodiment of the circuit structure of the target substrate of the die-bonding structure in FIG. 1.

With reference to FIG. 9, a second embodiment of the circuit structure 40 of the target substrate 10 in FIG. 1 differs from the relevant first embodiment in additionally providing an auxiliary bonding layer 46 and a wetting layer 47. In the present embodiment, the conventionally-provided parts remain the same as the first embodiment while the bonding-reinforced circuit layer additionally includes the auxiliary bonding layer 46 and the wetting layer 47. The auxiliary bonding layer 46 is formed on the eutectic metal layer 45 and is formed of titanium, titanium nitride, layers of titanium nitride and titanium stacked to each other, or layers of titanium nitride, titanium and titanium nitride sequentially stacked to each other. The wetting layer 47 is formed on the auxiliary bonding layer 46 and is formed of gold or silver. Being as a part of the circuit structure 40, the multiple electrical contacts 40a are formed on the wetting layer 47. In view of the additional auxiliary bonding layer 46 and the wetting layer 47, the bonding strength provided between the circuit structure 40 and the semiconductor elements 20 in the present embodiment is higher than that in the relevant first embodiment. Another advantage of the present embodiment is that the metal used in the wetting layer 47, such as gold or silver, has a lower eutectic temperature than copper to facilitate fast die-bonding process and ensure high bonding strength. However, regardless of the first relevant embodiment and the present embodiment, there is a required thickness for either of the eutectic metal layer 45 in the first embodiment of the circuit structure 40 and the eutectic metal layer 45 and the wetting layer 47 in the present embodiment. If the first embodiment attempts to have a similar bonding strength as provided between the wetting layer 47 and the LEDs in the present embodiment, the use of the precious metal, such as gold, appears to be the option but the eutectic metal layer 45 all in the precious metal in the required thickness turns out to be a less cost-effective solution. Alternatively, the present embodiment gives the flexibility in choosing the use of the precious metal in an optimal thickness of the wetting layer 47 while leaving the remaining thickness toward the required thickness by the use of inexpensive meal, such as copper, in the eutectic layer 45. As far as a measure balancing the factors of cost and bonding strength is concerned, the present embodiment simply meets the cost-effective concern without compromising the required bonding strength.

Figure 10:
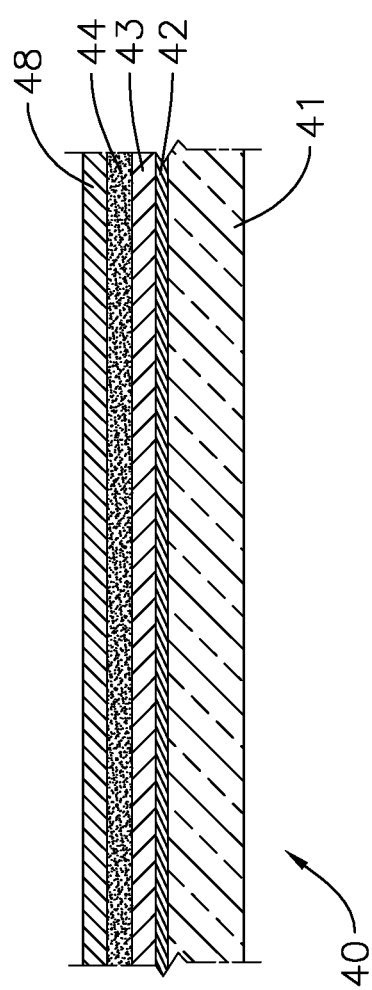
FIG. 10 is a schematic diagram showing a third embodiment of the circuit structure of the target substrate of the die-bonding structure in FIG. 1.

With reference to FIG. 10, a third embodiment of the circuit structure 40 of the target substrate 10 in FIG. 1 differs from the relevant first embodiment in the eutectic metal layer 46 replaced by a first composite layer 48, which is formed on the bonding layer 44 to function as both a eutectic metal layer and a metal barrier layer, and is formed of layers of titanium, aluminum, titanium, aluminum, nickel, platinum, gold sequentially stacked to each other. In the present embodiment, the conventionally-provided parts remain the same as the first embodiment while the bonding-reinforced circuit layer includes the bonding layer 44 and the first composite layer 48. Being as a part of the circuit structure 40, the multiple electrical contacts 40a are formed on the first composite layer 48.

Figure 11:
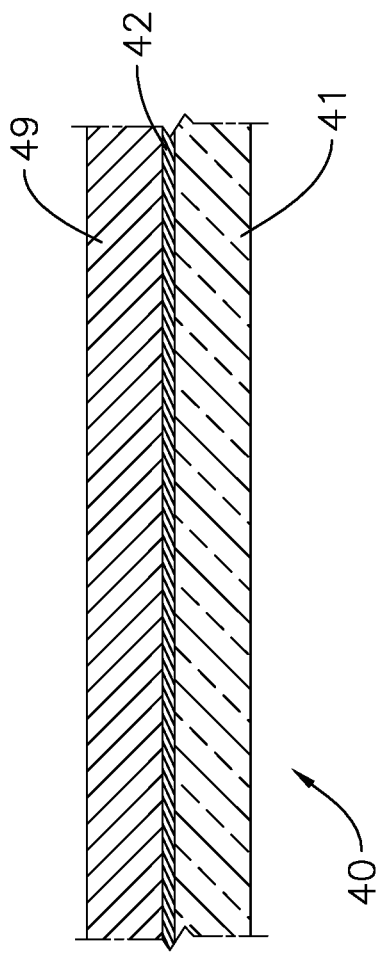
FIG. 11 is a schematic diagram showing a fourth embodiment of the circuit structure of the target substrate of the die-bonding structure in FIG. 1.

With reference to FIG. 11, a fourth embodiment of the circuit structure 40 of the target substrate 10 in FIG. 1 includes a glass plate 41, a transparent conductive layer 42 and a second composite layer 49. In the present embodiment, the conventionally-provided parts include the glass plate 41 and the transparent conductive layer 42, and the bonding-reinforced circuit layer includes the second composite layer 49. The transparent conductive layer 42 is formed on the glass plate 41. The second composite layer 49 is formed on the transparent conductive layer 42 and is formed of layers of chromium, aluminum, titanium, aluminum, nickel, platinum and gold sequentially stacked to each other. Being as a part of the circuit structure 40, the multiple electrical contacts 40a are formed on the second composite layer 49.

Figure 12:
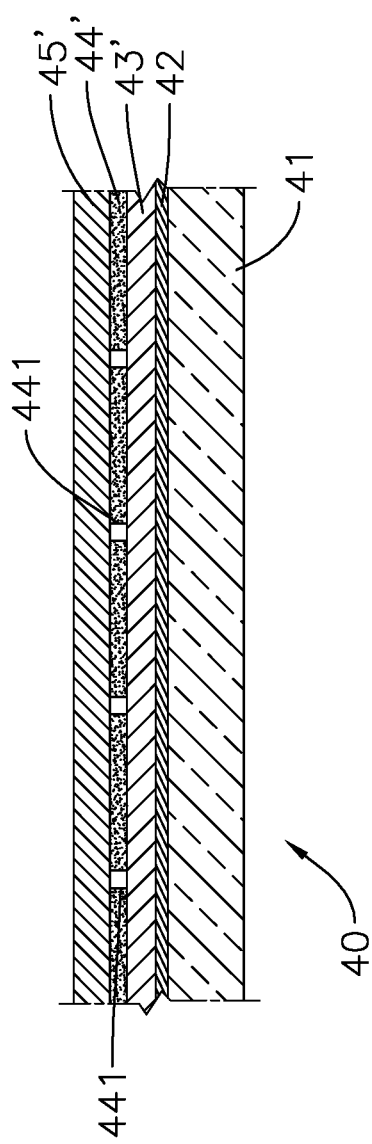
FIG. 12 is a schematic diagram showing a fifth embodiment of the circuit structure of the target substrate of the die-bonding structure in FIG. 1.

With reference to FIG. 12, a fifth embodiment of the circuit structure 40 of the target substrate 10 in FIG. 1 includes a glass plate 41, a transparent conductive layer 42, a first reinforced circuit layer 43', an insulating layer 44', and a second reinforced circuit layer 45'. The transparent conductive layer 42 is formed on the glass plate 41 and is used as an adhesive layer between the glass plate 41 and the first reinforced circuit layer 43'. The first reinforced circuit layer 43' is formed on the transparent conductive layer 42. The insulating layer 44' is formed on the first reinforced circuit layer 43' and has multiple vias 441 formed through the insulating layer 44'. The second reinforced circuit layer 45' is formed on the insulating layer 44'. The second reinforced circuit layer 45' is electrically connected to the first reinforced circuit layer 43' through the multiple vias 441 of the insulating layer 44'. The circuit structure with two metal layers in the present embodiment targets at implementation in analogy to multi-layer PCBs available in the market.

Figure 13:
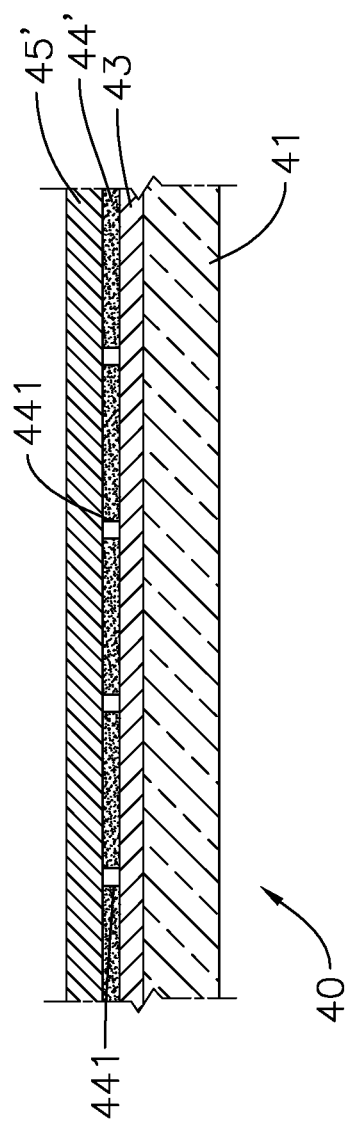
FIG. 13 is a schematic diagram showing a sixth embodiment of the circuit structure of the target substrate of the die-bonding structure in FIG. 1.

With reference to FIG. 13, a sixth embodiment of the circuit structure 40 of the target substrate 10 in FIG. 1 is a variant of the fifth embodiment and differs from the fifth embodiment in the unavailability of the transparent conductive layer 42. The transparent conductive layer 42 is optional because it only serves for the purpose of an adhesive layer for adhering to the glass plate and the metal layer next to it. Something else, such as a bonding layer, may be taken as an alternative for replacing the transparent conductive layer 42.

Figure 14:
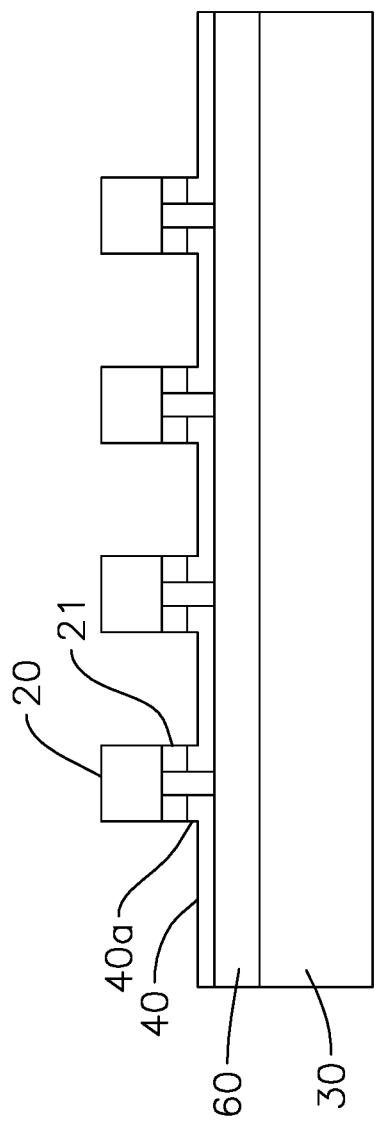
FIG. 14 is a schematic diagram showing a seventh embodiment of the circuit structure of the of the target substrate of the die-bonding structure in FIG. 1 having a backside reflector therein.

Each of the first reinforced circuit layer 43' and the second reinforced circuit layer 45' in FIGS. 12 and 13 may include the bonding layer 44 and a eutectic metal layer 45 with the metal layer 43 removed in FIG. 8, the bonding layer 44, the eutectic metal layer 45, the auxiliary bonding layer 46, and a wetting layer 47 with the metal layer 43 removed in FIG. 9, the bonding layer 44 and the first composite layer 48 with the metal layer 43 removed in FIG. 10, and the second composite layer 49 in FIG. 11. Furthermore, when the foregoing circuit structure 40 with the glass plate 41 is applied to a backlight source, owing to concern for lighting efficiency of the backlight source, a reflective layer needs to be incorporated into the target substrate 10 to reflect light generated by the semiconductor elements, such as LEDs. With reference to FIG. 14, a seventh embodiment of the circuit structure 40 of the target substrate 10 in FIG. 1 differs from the foregoing relevant embodiments in the target substrate 10 further having an additional backside reflector 60 formed between the supporting base 30 and the circuit structure 40. Supposing that the supporting base 30 includes a glass plate, the backside reflector 60 thus don't need to have a glass plate therein.

Figure 15:
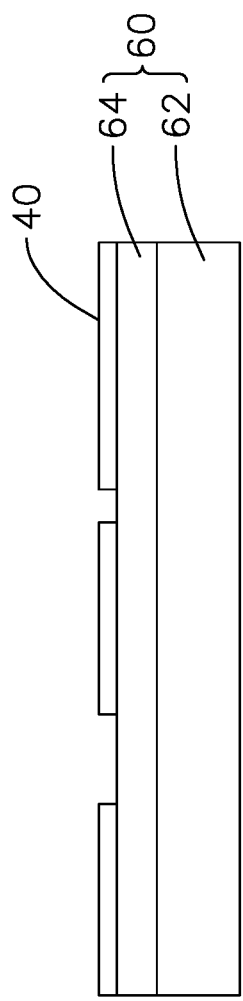
FIG. 15 is a schematic diagram showing a first embodiment of the backside reflector in FIG. 14.

In a first embodiment relevant to the backside reflector 60, with reference to FIG. 15, the backside reflector 60 includes a reflective layer 62, and an insulating dielectric layer 64. The reflective layer 62 is formed on the supporting base 30 by depositing aluminum on the supporting base 30 and serves to only reflect light irradiated thereto but not to electrically conduct. The insulating dielectric layer 64 is formed on the reflective layer 62 by depositing silicon dioxide on the reflective layer 62. The circuit structure 40 is formed on the insulating dielectric layer 64. It is understood that the insulating dielectric layer 64 is located between the reflective layer 62 and the circuit structure 40 of the target substrate 10, thus allowing itself to isolate and insulate the reflective layer 62 from the circuit structure 40 of the target substrate 10.

Figure 16:
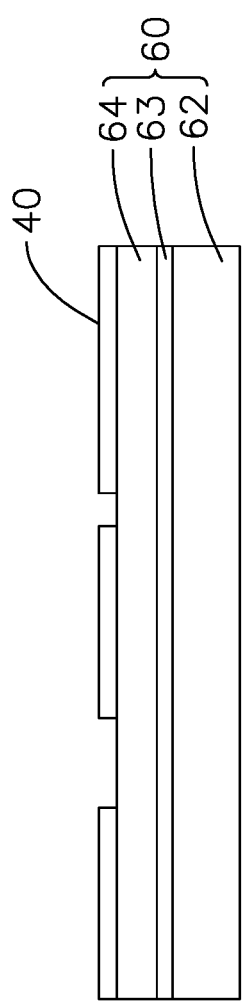
FIG. 16 is a schematic diagram showing a second embodiment of the backside reflector in FIG. 14.

In a second embodiment relevant to the backside reflector 60, with reference to FIG. 16, the present embodiment differs from the relevant first embodiment in an additional treated film 63. When formed on the reflective layer 62, the insulating dielectric layer 64 may become porous. Due to the porosity, the short-circuit issue may be caused by interconnections formed through the insulating dielectric layer 64 in connection with the circuit structure 40 and the reflective layer 62. To address the short-circuit issue, the treated film 63 is brought into play as an insulating layer to isolate the reflective layer 62 from the interconnections and to avoid occurrence of short circuit through the interconnections between the circuit structure 40 and the reflective layer 62. To that end, the treated film 63 is formed by using a furnace tube to oxidize or nitride a top portion of the reflective layer 62, such that the treated film 63 in the form of metal oxide or metal nitride can be used to protect against the short-circuits. The insulating dielectric layer 64 is then formed on the treated film 63 by depositing silicon dioxide on the treated film 63. The circuit structure 40 is formed on the insulating dielectric layer 64.

To tackle the warpage issue of circuit boards occurring in a conventional reflow process, the die-bonding structure described above enables the alignment between electrodes 21 of semiconductor elements 20 and electrical contacts 40a of the circuit structure 40 on the target substrate 10 and utilizes a beam generator 50 to generate at least one energy beam 51 for heating and electrically connecting the pairs of electrodes 21 of the semiconductor elements 20 and the electrical contacts 40a of the target substrate 10. After the pairs of electrodes 21 of the multiple semiconductor elements 20 and the respective electrical contacts 40a of the target substrate 40 are well-aligned, as the multiple electrical contacts 40a of the target substrate 10 are the portions of the target substrate 10 to be bonded only by the at least one energy beam 51, it can be seen that the heating pattern in the present invention only involves heated dots partially scattering over the target substrate 40 unlike the overall target substrate being placed in an oven as in a conventional reflow process. In contrast to the conventional reflow process, the target substrate 10 in the present invention absorbs less heat because of such dot-scattering heating pattern, which is effective in avoiding excessively-concentrated thermal stress acted on certain areas to in turn give rise to the warpage issue. Moreover, as to the selection of types of bonding materials and the on-glass TFT-LCD/AMOLED circuits, both target at providing higher bonding strength between the semiconductor elements 20 and the target substrate 10.

Figure 17:
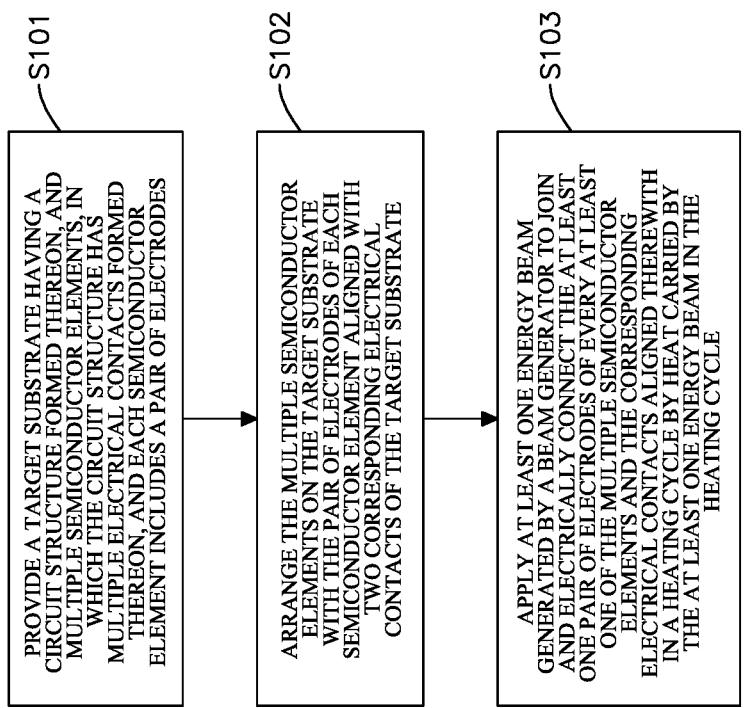
FIG. 17 is a flow diagram showing a die-bonding method in accordance with the present invention.

With reference to FIG. 17, a die-bonding method in accordance with the present invention includes the following steps.

Step S101: Provide a target substrate 10 having a circuit structure 40 formed thereon, and multiple semiconductor elements 20, in which the circuit structure 40 has multiple electrical contacts 40a formed thereon, and each semiconductor element 20 includes a pair of electrodes 21. Each of the multiple semiconductor elements 20 may be a light-emitting diode (LED) including the pair of electrodes and multiple light-emitting layers stacked to each other but is not limited thereto. The target substrate 10 may include but is not limited to one of a printed circuit board (PCB), a flexible PCB, a glass circuit board, and a backplane with thin-film transistor (TFT) circuits or pulse width modulation (PWM) driving circuits.

Step S102: Arrange the multiple semiconductor elements 20 on the target substrate 10 with the pair of electrodes 21 of each semiconductor element 20 aligned with two corresponding electrical contacts 40a of the target substrate 10.

Step S103: Apply at least one energy beam 51 generated by a beam generator 50 to join and electrically connect the at least one pair of electrodes 21 of every at least one of the multiple semiconductor elements 20 and the corresponding electrical contacts 40a aligned therewith in a heating cycle by heat carried by the at least one energy beam in the heating cycle until the pairs of electrodes 21 of the multiple semiconductor elements 20 and the respective electrical contacts 40a of the target substrate 10 aligned therewith are completely heated and electrically connected.

Figure 3:
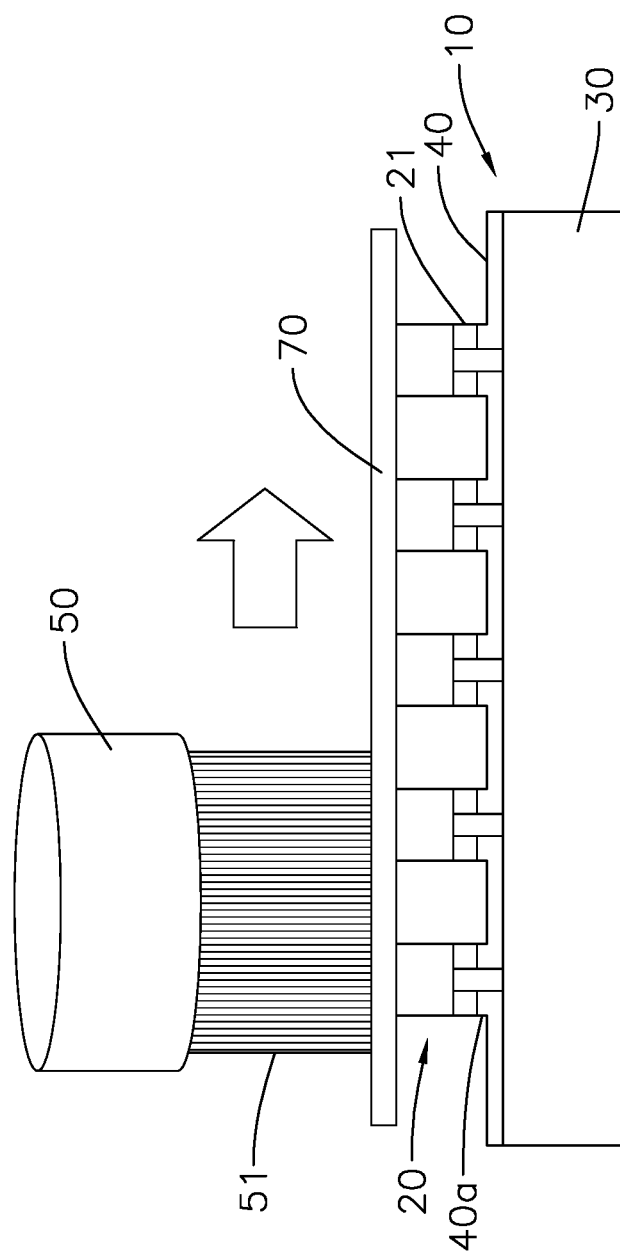
FIG. 3 is a schematic diagram showing an embodiment of a beam generator of the die-bonding structure generating an energy beam to heat two semiconductor elements and corresponding electrical contacts of a die-bonding structure in accordance with the present invention.
Figure 4:
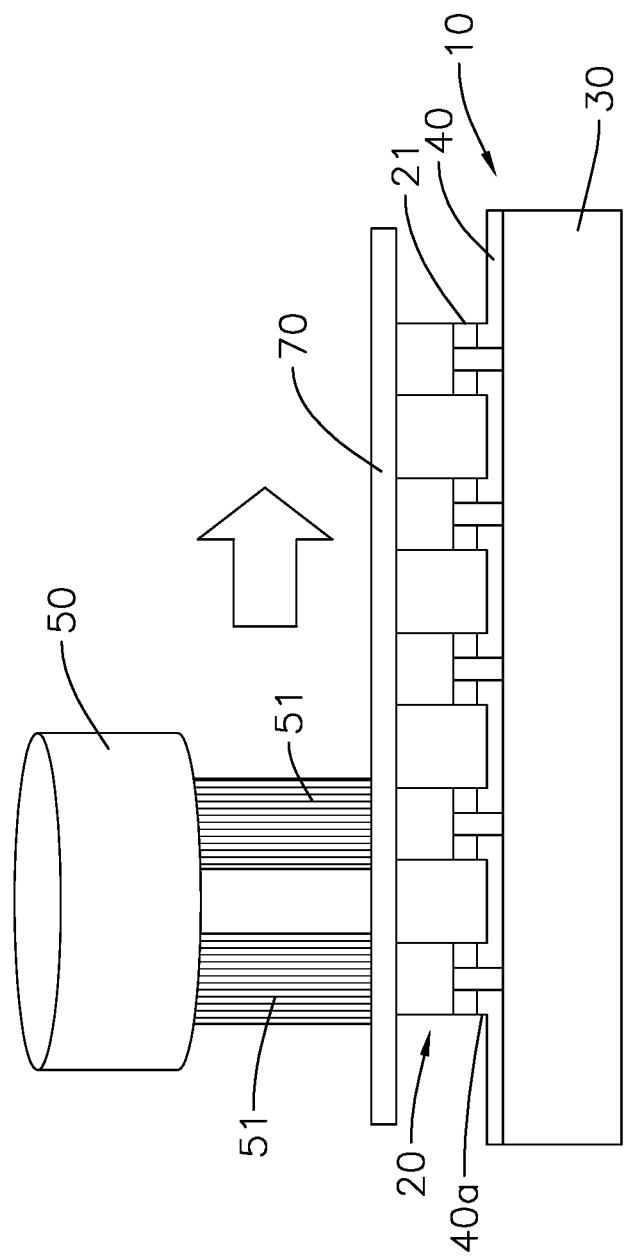
FIG. 4 is a schematic diagram showing another embodiment of a beam generator of the die-bonding structure generating two energy beams to respectively heat two semiconductor elements and corresponding electrical contacts of a die-bonding structure in accordance with the present invention.

Speaking of the number of the at least one energy beam 51 generated by the beam generator 50, the at least one energy beam 51 may include one energy beam 51 as shown in FIG. 1, applied to heat and electrically connect the pair of electrodes 21 of one of the multiple semiconductor elements 20 and two corresponding electrical contacts 40a of the target substrate 10 as shown in FIG. 1 or the pairs of electrodes 21 of at least two of the multiple semiconductor elements 20 and the corresponding electrical contacts 40a of the target substrate 10 as shown in FIG. 3 in the heating cycle. Alternatively, as shown in FIG. 4, the at least one energy beam 51 may include at least two energy beams 51 applied to respectively heat and electrically connect the pairs of electrodes 21 of at least two of the multiple semiconductor elements 20 and the corresponding electrical contacts 40a of the target substrate 10 in the heating cycle. The foregoing heating cycles are all in a range of 0.01 second to 1 second.

With regard to the types of the at least one energy beam 51, each of the at least one energy beam 51 may be a laser beam producing one of ultraviolet (UV) light, visible light and infrared (IR) light. When each of the at least one energy beam 51 is an IR laser beam, a wavelength of the IR laser beam is in a range of 1,000 nm to 2,000 nm.

Furthermore, depending on the locations of the beam generator 50 being placed, in step S103, when the beam generator 50 is placed next to the multiple semiconductor elements 20 as shown in FIG. 1, heat carried by the at least one energy beam 51 in the heating cycle transfers to the at least one pair of electrodes 21 of the every at least one of the multiple semiconductor elements 20 and the corresponding electrical contacts 40a aligned therewith through the at least one of the multiple semiconductor elements 20; when the beam generator 50 is placed next to the target substrate 10 as shown in FIG. 2, heat carried by the at least one energy beam 50 in the heating cycle transfers to the at least one pair of electrodes 21 of the every at least one of the multiple semiconductor elements 20 and the corresponding electrical contacts 40a through the target substrate 10. As explained earlier, the benefits for placing the beam generator 50 on the same side as the target substrate 10 include a shorter heating cycle and increased efficiency in fabrication and less impact on the semiconductor elements 20 as a result of the heating effect of beam generator 50.

Figure 18A:
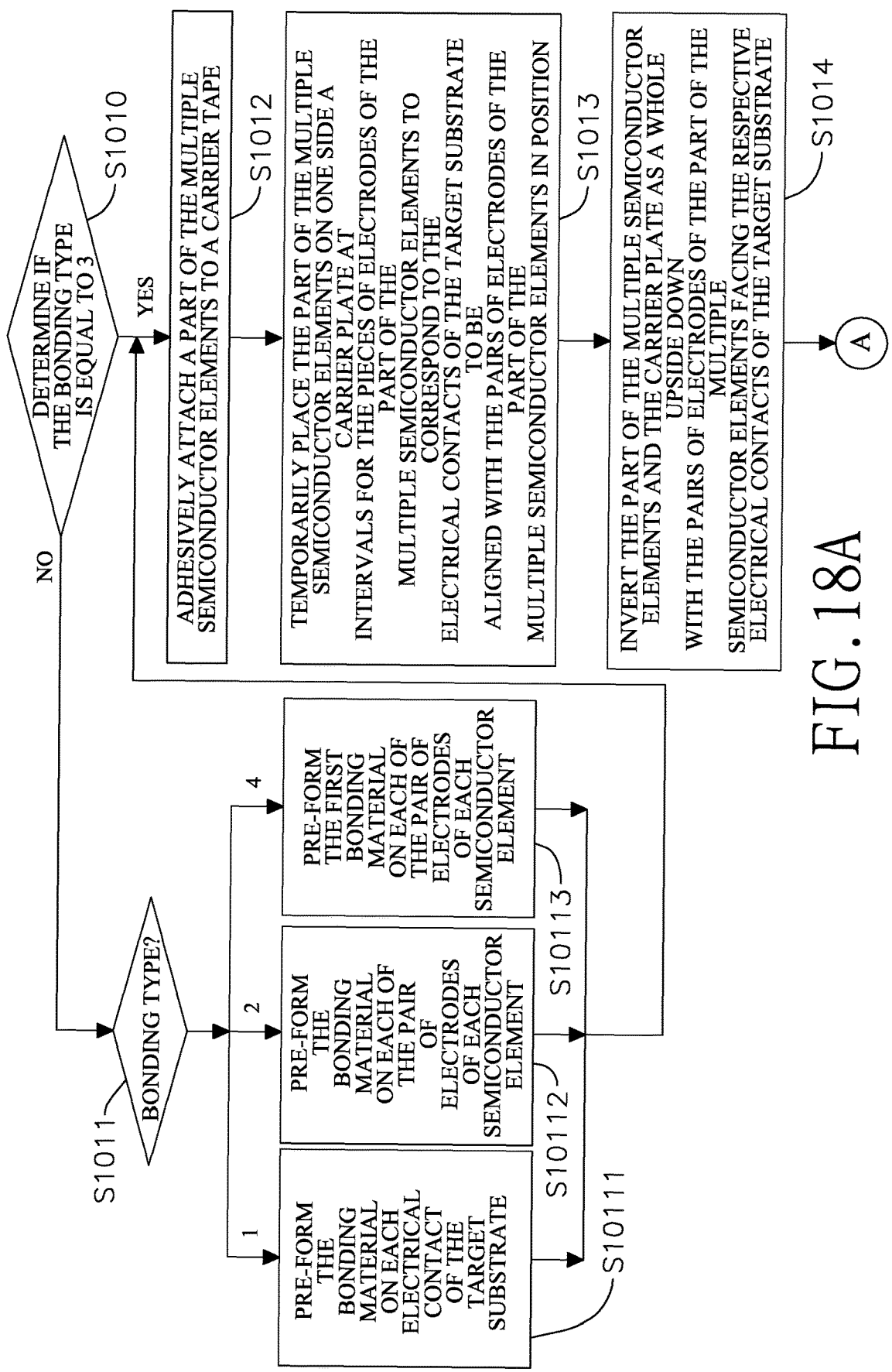
FIGS. 18A and 18B are a flow diagram showing an embodiment associated with sub-steps of providing a target substrate having a circuit formed thereon and multiple semiconductor elements in FIG. 17.
Figure 18B:
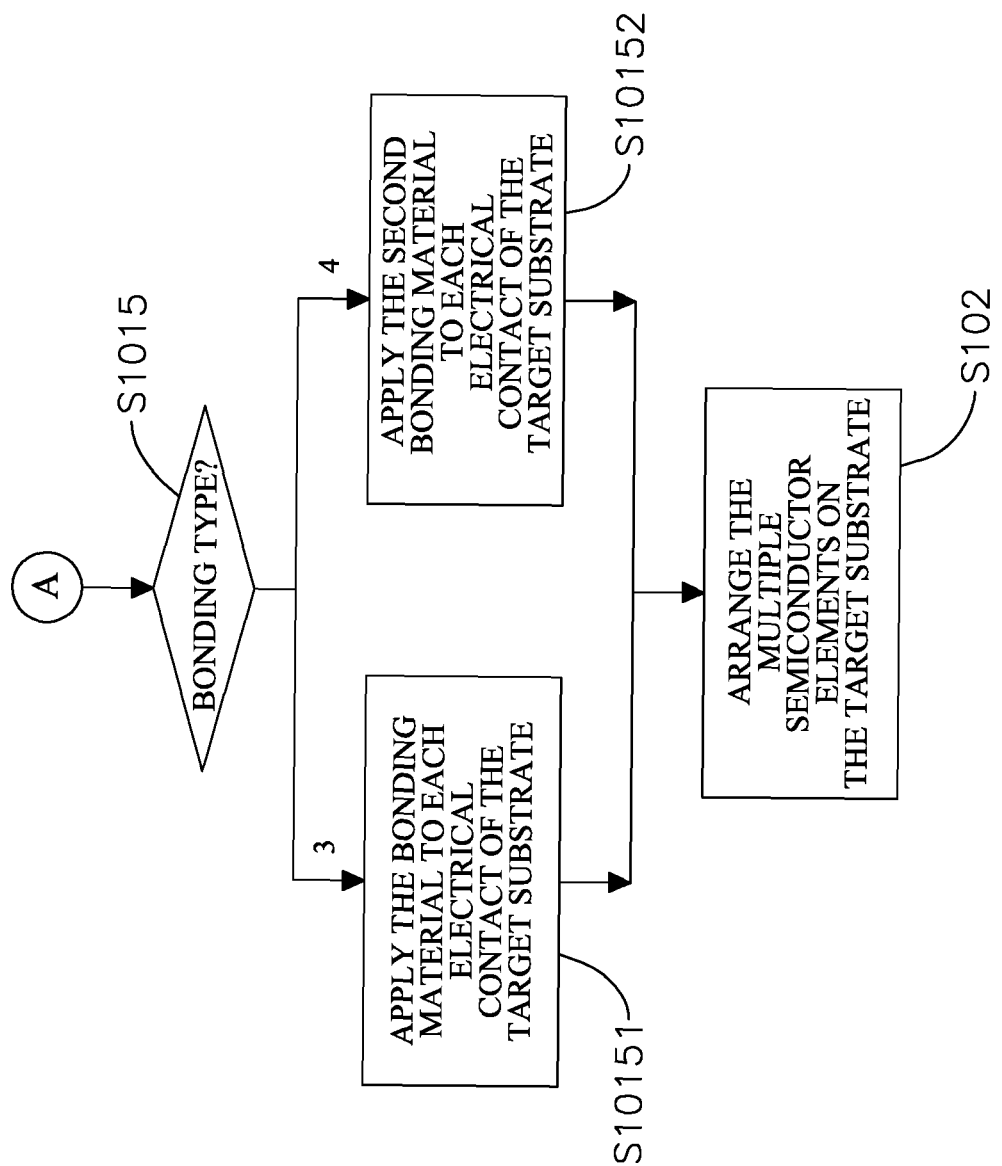

With reference to FIGS. 1, 18A and 18B, step S101 further includes the following steps for determining the bonding type and performing actions corresponding to arrangement of bonding material as depicted earlier for enhancement of bonding strength, and arranging the multiple semiconductor elements 20 initially loaded on a carrier tape 90 on a carrier plate as a pre-preparation before the alignment between the semiconductor elements 20 and the electrical contacts 40a of the target substrate 10 in step 102. Definition of the bonding types and action taken corresponding thereto for pre-forming and applying the bonding materials on the required locations is first depicted in the next. When the bonding type is one, it represents that the at least one bonding material includes one bonding material and the bonding material is pre-formed on the electrical contacts 40a of the circuit structure 40 of the target substrate 10 during fabrication process of the target substrate 10; when the bonding type is two, it represents that the at least one bonding material includes one bonding material and the bonding material is pre-formed on the pairs of electrodes 21 of the semiconductor elements 20 during fabrication of the semiconductor elements 20; when the bonding type is three, it represents that the at least one bonding material includes one bonding material and the bonding material is applied to the electrical contacts 40a of the circuit structure 40 of the target substrate 10; when the bonding type is four, it represents that the at least one bonding material includes two bonding materials and one of the two bonding materials is pre-formed on the pairs of electrodes 21 of the semiconductor elements 20 and the other bonding material is applied to the electrical contacts 40a of the circuit structure 40 of the target substrate 10 before the electrodes 21 are aligned with the respective electrical contacts 40a. In step S101, preparation of the target substrate 10 and the multiple semiconductor elements 40 will start with steps S1010, S1011, and S10111 to S10113 for pre-forming relevant bonding materials onto corresponding positions of the target substrate 10 and the multiple semiconductor elements 40.

Step S1010: Determine if the bonding type is equal to three. If the determination result is positive, perform step S1012. Otherwise, perform step S1011.

S1011: Determine a number of the bonding type. When the bonding type is equal to 1, 2 and 4, perform steps S10111, S10112 and S10113 respectively.

Figure 5:
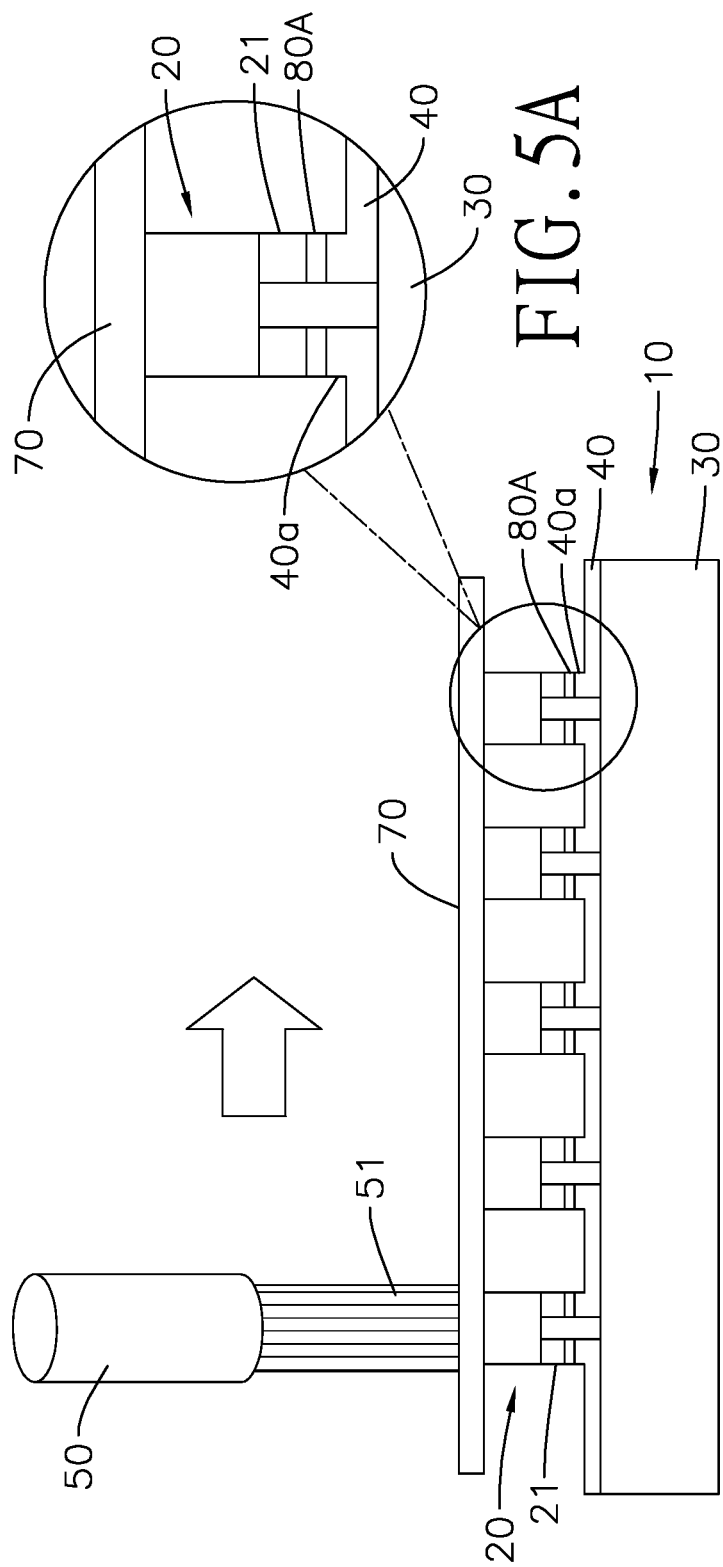
FIG. 5 is a schematic diagram showing a first embodiment of a bonding material pre-formed on the pairs of electrodes of the semiconductor elements of the die-bonding structure in FIG. 1.

S10111: Pre-form the bonding material on each electrical contact 40a of the target substrate 10. The bonding material may be the solder paste 80A as shown in FIGS. 5 and 5A.

S10112: Pre-form the bonding material on each of the pair of electrodes 21 of each semiconductor element 20. The bonding material may be the solder paste 80A as shown in FIGS. 5 and 5A.

Figure 7:
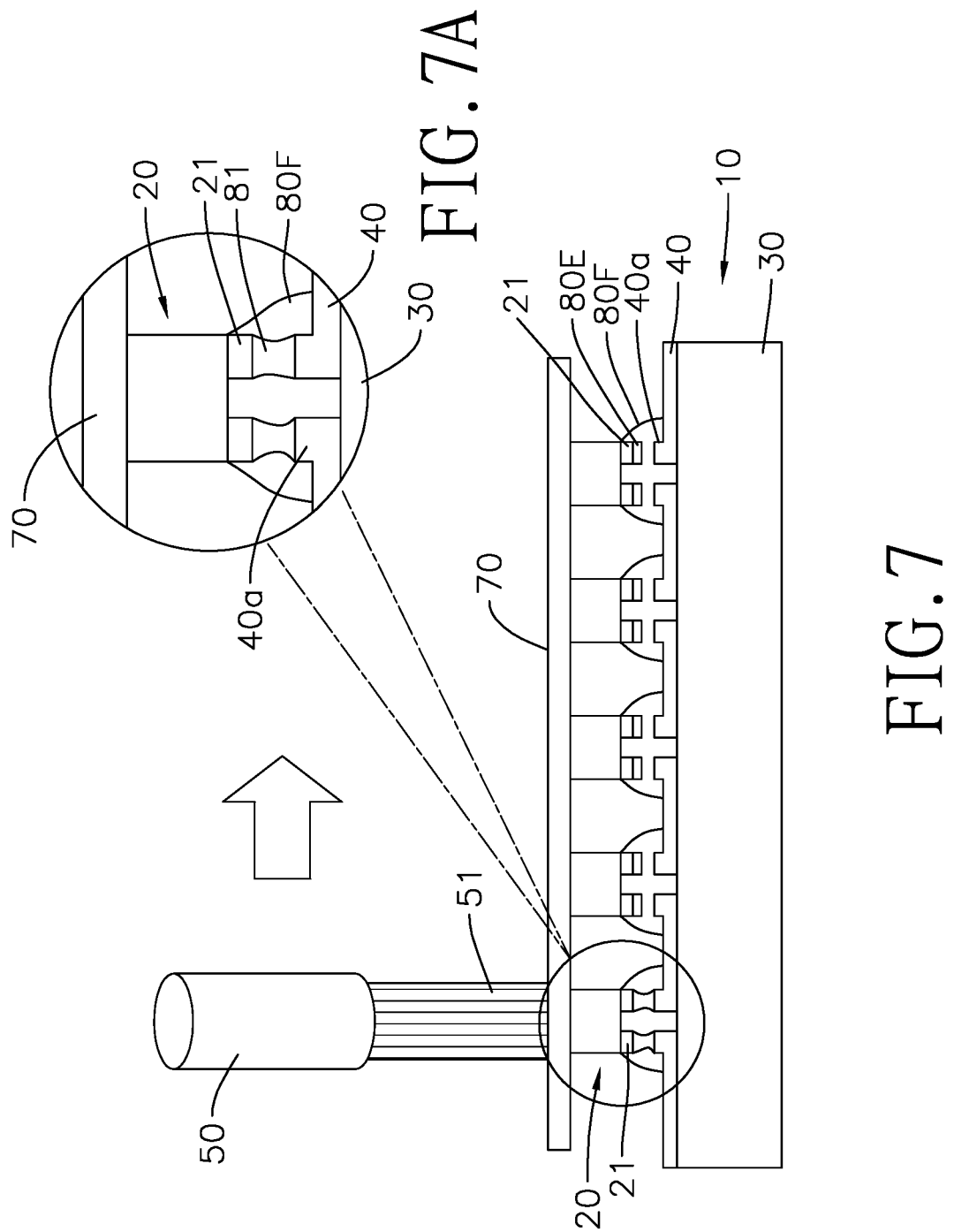
FIG. 7 is a schematic diagram showing a third embodiment of two bonding materials respectively pre-formed on each electrode and a corresponding electrical contact of the die-bonding structure in FIG. 1.

S10113: Pre-form the first bonding material on each of the pair of electrodes 21 of each semiconductor element 20. The first bonding material may be a metal layer 80E of tin or tin-silver coated on each of the pair of electrodes 21 of each semiconductor element 20 as shown in FIGS. 7 and 7A.

Step S1012: Adhesively attach a part of the multiple semiconductor elements 20 to a carrier tape 90. The carrier tape 90 may be blue tape but not limited thereto.

Step S1013: Temporarily place the part of the multiple semiconductor elements 20 on one side a carrier plate at intervals for the pieces of electrodes 21 of the part of the multiple semiconductor elements 20 to correspond to the electrical contacts 40a of the target substrate 10 to be aligned with the pairs of electrodes 21 of the part of the multiple semiconductor elements 20 in position. The carrier plate may be one of ultraviolet (UV) tape, thermal release tap, and blue tape but not limited thereto, and is sticky on the side thereof with the part of the multiple semiconductor elements 20 attached thereto. The stickiness of the side may be lowered by UV illumination or heating.

Step S1014: Invert the part of the multiple semiconductor elements 20 and the carrier plate as a whole upside down with the pairs of electrodes 21 of the part of the multiple semiconductor elements 20 facing the respective electrical contacts 40a of the target substrate 10.

To further enhance bonding strength between the multiple semiconductor elements 20 and the target substrate 10, steps S101 further includes the following steps for applying corresponding bonding materials to the multiple semiconductor elements 20 and the target substrate 10 according to the bonding type.

Step S1015: Determine a number of the bonding type. When the bonding type is equal to 3 or 4, perform steps S10151 or S10152.

Figure 6:
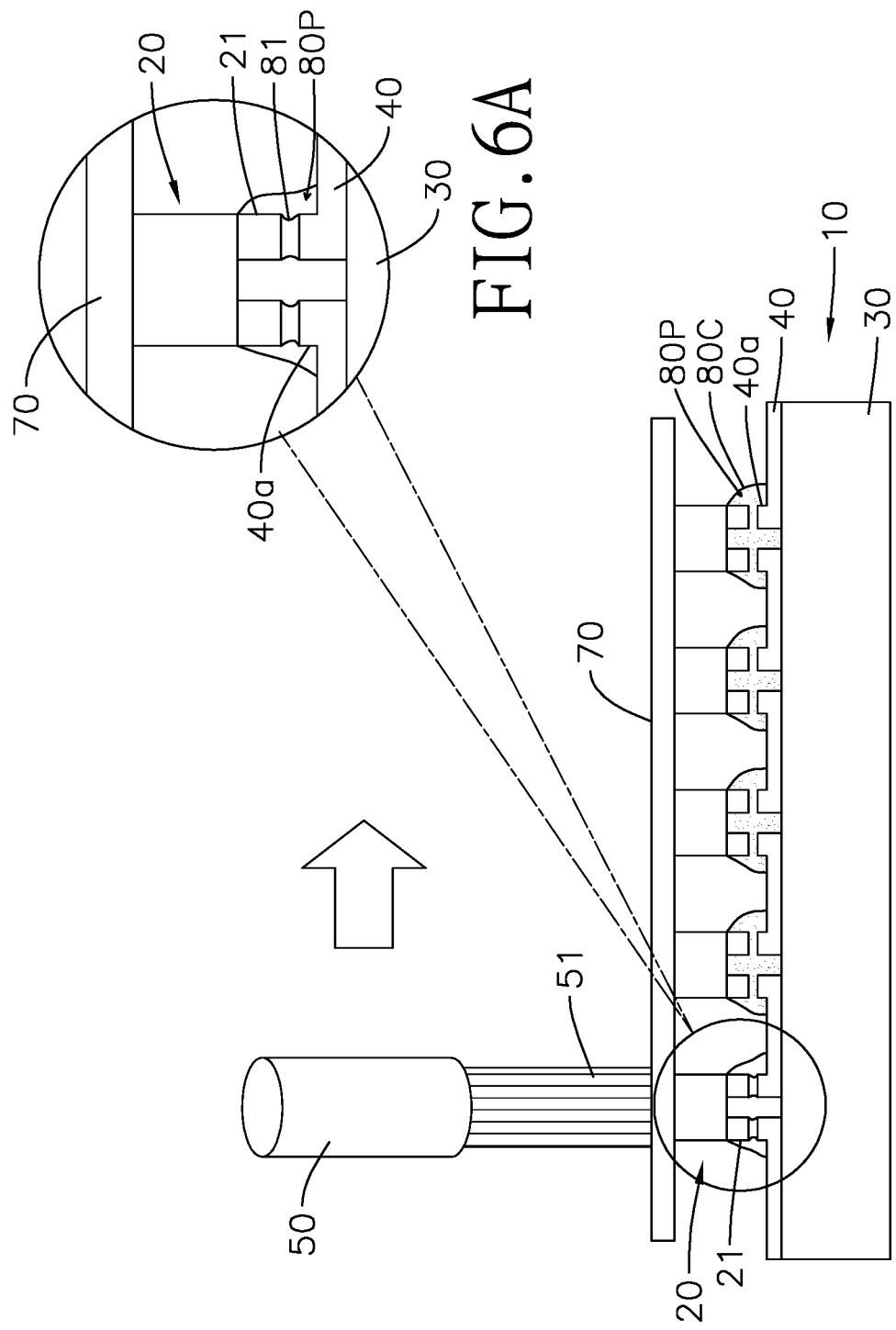
FIG. 6 is a schematic diagram showing a second embodiment of a bonding material applied to each electrical contact of the die-bonding structure in FIG. 1.

S10151: Apply the bonding material to each electrical contact 40a of the target substrate 10. The bonding material may be the flux, adhesive containing flux, or adhesive 80C as shown in FIGS. 6 and 6A, S10152: Apply the second bonding material to each electrical contact 40a of the target substrate 10. The second bonding material may be adhesive or adhesive containing flux 80F containing metal particles (not shown) selected from one of a group of metals including tin, titanium, indium, and silver, or adhesive 80F containing no metallic particles (not shown) as shown in FIGS. 7 and 7A. After step S10151 or step S1052 is done, perform step S102.

S102: Arrange the multiple semiconductor elements 20 on the target substrate 10.

Supposing that the multiple semiconductor elements 20 are light-emitting elements, for example LEDs, to ensure uniform lighting provided by the LEDs, light output surfaces of the LED, i.e. top surfaces of the LEDs, need to be flush with each other. Moreover, upon die-bonding red, green and blue LEDs, due to a different structure, the red LEDs upon being heated by the at least one energy beam 51 are more prone to burn-out than the green and blue LEDs when the red, green and blue LEDs are simultaneously subject to a same heating condition using the at least one energy beam 51. Since the red, green and blue colors constitute the three primary colors, red, green and blue LEDs are all essential lighting elements used for lighting devices generating colored light. As a result, the following embodiments are provided to tackle the burn-out issue of the red LEDs during heating red, green and blue LEDs simultaneously in the die-bonding process.

In a first embodiment, upon die-bonding red, green and blue LEDs, the energy transferred to the red LEDs may be configured to a first energy level at a first heating cycle relative to a second energy level to the green and blue LEDs at a second heating cycle. As far as the degree of heat-resistant capability is concerned, the first energy level is lower than the second energy level. Meanwhile, the first heating cycle is longer than the second heating cycle. Accordingly, the higher second energy level applied to the green and blue LEDs means that the green and blue LEDs are more heat-resistant than the red LEDs and the longer first heating cycle for the red LEDs is to compensate the energy deficiency arising from the reduced energy level applied thereto. Given as a non-limited example for the present embodiment, the energy level of the at least one energy beam 51 for the red LEDs may be level 1 and the energy level of the at least one energy beam 51 for the green and blue LEDs may be level 5, which is higher and more heat-resistant than level 1, and the first heating cycle for the red LEDs may be 8 milliseconds and the second heating cycle for the green and blue LEDs may be 2 milliseconds. Because such approach involves two different energy levels applied by the at least one energy beam 51, the resultant heating processes under irradiation of the at least one energy beam 51 at different energy levels for the green and blue LEDs and for the red LEDs need to be separated as two different heating processes, indicating that after one of a group of all the red LEDs and a group of all the green and blue LEDs is heated by one the two heating processes, the other heating process is then applied to heat the other group.

In a second embodiment, for die-bonding red, green and blue LEDs, one energy level of the at least one energy beam 51 applied to the red, green and blue LEDs and one heating cycle for the red LEDs and the green and blue LEDs are configured instead. As the red LEDs are less heat-resistant and more prone to burn-out, the energy levels applied to the red, green and blue LEDs are dominated by one that the red LEDs can withstand without the burn-out issue. Thus, for avoidance of the burn-out issue, a lower energy level is chosen for the sake of the red LEDs. To work with the lower energy level, a longer heating cycle is desired to allow enough heat to transfer to all the LEDs, particularly to the green and blue LEDs, during the die-bonding process. Given as a non-limited example to the present embodiment, the energy level of the at least one energy beam 51 for the red, green and blue LEDs may be level 1, which is a relatively lower energy level dominated by the red LEDs, and the heating cycle for the red, green and blue LEDs may be 8 milliseconds, which intends to extend the heating cycle for enough heat to transfer to all the LEDs, particularly to the green and blue LEDs, during the die-bonding process. Despite a longer heating cycle, the present embodiment doesn't need to have two different heating processes as required in the first embodiment and therefore simplifies the die-bonding process. In contrast to the first embodiment, the group of all the red LEDs and the group of all the green and blue LEDs can be simultaneously applied by the single heating process with a single energy level throughout the entire die-bonding process.

Figure 19:
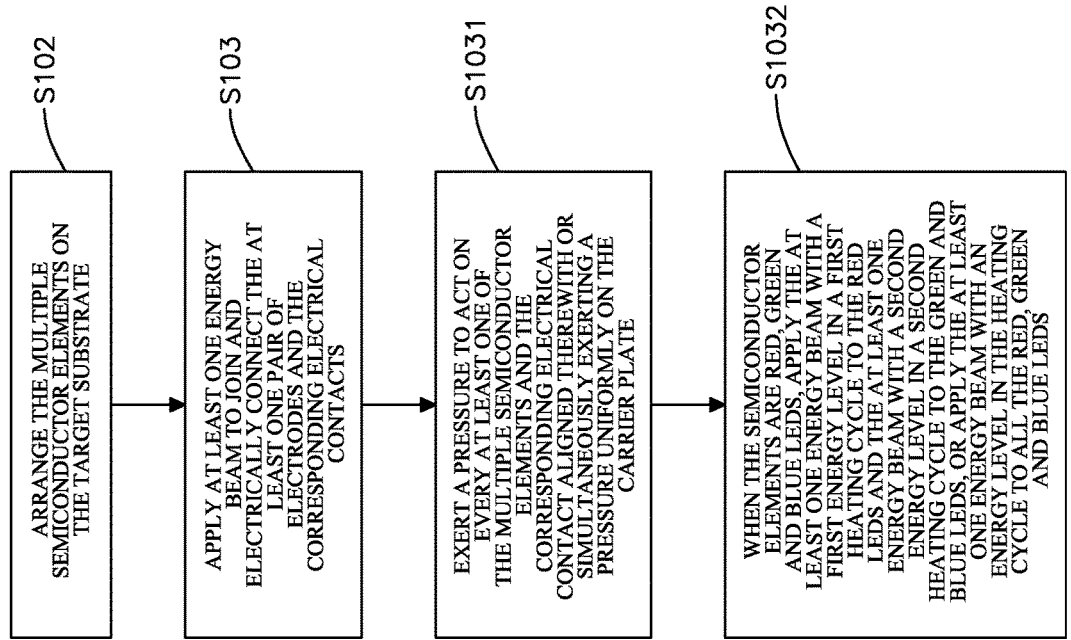
FIG. 19 is a flow diagram showing an embodiment associated with sub-steps of applying at least one energy beam in FIG. 17.

To meet the foregoing end, after step S102 is completed, with reference to FIG. 19, step S103, arranging the multiple semiconductor elements 20 on the target substrate 10, and its sub-steps S1031 and S1032 as depicted below are performed.

Step S1031: Exert a pressure to act on every at least one of the multiple semiconductor elements 20 and the corresponding electrical contact 40a aligned therewith or simultaneously exerting a pressure uniformly on the carrier plate to individually act on every at least one of the multiple semiconductor elements 20 and the corresponding electrical contacts 40a aligned therewith or simultaneously act on the multiple semiconductor elements 20 and the corresponding electrical contacts 40a aligned therewith in the heating cycle.

S1032: When the semiconductor elements 40 are red, green and blue LEDs, apply the at least one energy beam 51 with a first energy level in a first heating cycle to the red LEDs and the at least one energy beam 51 with a second energy level relative to the first energy level in a second heating cycle to the green and blue LEDs, in which the first energy level is lower than the second energy level and is so configured not to burn out the red LEDs in the first heating cycle, and the first heating cycle is longer than the second heating cycle, or apply the at least one energy beam with an energy level in the heating cycle to all the red, green and blue LEDs, in which the energy level and the heating cycle are so configured not to burn out the red LEDs in the heating cycle. The identical energy level to all the red, green and blue LEDs can be achieved by improvement on the red, green and blue LED chip design and adjustment of the focal length of the energy beam.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A die-bonding structure comprising:
   a target substrate comprising:
      a supporting base; and
      a circuit structure formed on one side of the supporting base and having a pair of electrical contacts;
   a carrier plate;
   a plurality of light-emitting diodes (LEDs) arranged between the target substrate and the carrier plate, and comprising a first LED which is attached to the carrier plate and has a pair of electrodes aligned with the pair of electrical contacts of the target substrate;
   an adhesive material arranged between the pair of electrodes and the pair of electrical contacts; and
   a beam generator capable of generating an energy beam to pass through the carrier plate and heat the adhesive material in a dot distribution.

2. The die-bonding structure as claimed in claim 1, wherein the target substrate includes one of a printed circuit board (PCB), a flexible PCB, a glass circuit board, and a backplane with thin-film transistor (TFT) circuits or pulse width modulation (PWM) driving circuits.

3. The die-bonding structure as claimed in claim 2, wherein the circuit structure is a TFT liquid crystal display (LCD) circuit or an Active Matrix Organic Light Emitting Diode (AMOLED) circuit.

4. The die-bonding structure as claimed in claim 1, wherein a bonding-reinforced circuit layer on which the pair of electrical contacts is formed.

5. The die-bonding structure as claimed in claim 4, wherein the circuit structure comprises a metal layer on which the bonding-reinforced circuit layer is formed and is formed of molybdenum, aluminum, or aluminum neodymium (AlNd).

6. The die-bonding structure as claimed in claim 4, wherein the bonding-reinforced circuit layer comprises:

a eutectic metal layer;

an auxiliary bonding layer formed on the eutectic metal layer; and a wetting layer formed on the auxiliary bonding.

7. The die-bonding structure as claimed in claim 5, wherein the circuit structure comprises a transparent conductive layer on which the metal layer is formed, and is formed of indium tin oxide (ITO), indium zinc oxide (IZO) or indium gallium zinc oxide (IGZO).

8. The die-bonding structure as claimed in claim 1, further comprising a backside reflector formed between the supporting base and the circuit structure.

9. The die-bonding structure as claimed in claim 8, wherein the supporting base includes a glass plate.

10. The die-bonding structure as claimed in claim 8, wherein the backside reflector includes:

a reflective layer;

a treated film formed by oxidizing or nitriding a top portion of the reflective layer; and an insulating dielectric layer formed on the treated film.

11. The die-bonding structure as claimed in claim 10, wherein the reflective layer is formed of aluminum, the treated film is formed of metal oxide or metal nitride, and the insulating dielectric layer is formed of silicon dioxide.

12. The die-bonding structure as claimed in claim 1, wherein the energy beam has a heating cycle is in a range of 0.01 second to 1 second.

13. The die-bonding structure as claimed in claim 1, wherein the energy beam applied to heat at least two of the plurality of LEDs.

14. The die-bonding structure as claimed in claim 1, wherein the energy beam is a laser beam configured to produce ultraviolet (UV) light, visible light or infrared (IR) light.

15. The die-bonding structure as claimed in claim 1, wherein adhesive material comprises an insulating adhesive and a plurality of metal particles dispersed in the insulating adhesive.

16. The die-bonding structure as claimed in claim 1, wherein each of the pair of electrical contacts comprises a metal layer which comprises tin or tin-silver.

17. The die-bonding structure as claimed in claim 1, wherein the energy beam is capable of passing through the first LED to heat the adhesive material.

18. The die-bonding structure as claimed in claim 1, wherein adhesive material comprises flux.

19. The die-bonding structure as claimed in claim 1, wherein the beam generator is capable of generating another energy beam separated from the energy beam.

20. The die-bonding structure as claimed in claim 1, wherein the plurality of LEDs comprises a second LED connected to the circuit structure by another adhesive material, when the first LED is heated by the energy beam, the adhesive material is melted, and another adhesive material is not melted.

* * * * *